(12) United States Patent
Higashi et al.

(10) Patent No.: US 6,555,925 B1
(45) Date of Patent: Apr. 29, 2003

(54) SEMICONDUCTOR DEVICE AND PRODUCING METHOD THEREOF

(75) Inventors: Kazuyuki Higashi, Yokohama (JP); Noriaki Matsunaga, Chigasaki (JP); Akihiro Kajita, Yokohama (JP); Tamao Takase, Yokohama (JP); Hisashi Kaneko, Fujisawa (JP); Hideki Shibata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/517,187

(22) Filed: Mar. 2, 2000

(30) Foreign Application Priority Data

Mar. 3, 1999 (JP) .............................. 11-055703

(51) Int. Cl.$^7$ ............................................ H01L 23/544
(52) U.S. Cl. ........................................ 257/797; 438/401
(58) Field of Search .................................. 438/401, 687, 438/975, 462; 257/797; 148/DIG. 102

(56) References Cited

U.S. PATENT DOCUMENTS 5,002,902 A  *  3/1991  Watanabe .................... 437/235
5,532,520 A  *  7/1996  Haraguchi et al. ........... 257/797

* cited by examiner

Primary Examiner—Kevin M. Picardat
(74) Attorney, Agent, or Firm—Finnegan, Henderson, Farabow, Garrett & Dunner, L.L.P.

(57) ABSTRACT

The present invention is a method of producing a semiconductor device in which at least one alignment mark to be used in an exposure process of a lithographic process is formed of a wiring material which is copper or includes copper as a main component, and the alignment mark is formed entirely in an area outside an area where dicing is to be executed.

12 Claims, 3 Drawing Sheets

SEMICONDUCTOR DEVICE AND PRODUCING METHOD THEREOF

CROSS-REFERENCE TO RELATED APPLICATION

This application is based upon and claims the benefit of priority from the prior Japanese Patent Application No. 11-055703, filed Mar. 3, 1999, the entire contents of which are incorporated herein by reference.

BACKGROUND OF THE INVENTION

The present invention relates to a semiconductor device and a producing method thereof, and particularly to the technique of dicing.

A plurality of semiconductor integrated circuits are generally produced on a single semiconductor wafer. Normally, elements and wiring are formed on a wafer, the wafer is cut along dicing lines, and the individual integrated circuit is divided into a plurality of chips.

Alignment marks for alignment of each layer are formed in a dicing line area. Therefore, the alignment marks may be damaged by the dicing and a material used for the alignment marks may adhere to the chips. Generally, the same material as that of the wiring is used for the alignment marks. In a conventional semiconductor integrated circuit, aluminum (Al) is used as the wiring material and a serious problem does not particularly occur even if Al adheres to the chips.

Recently, a request to use copper (Cu) for the wiring as the wiring material of a lower resistance has been increased. It is known that Cu gives a bad influence to the element characteristics such as the variation in the threshold voltage of the semiconductor element since Cu easily diffuses in $SiO_2$ and Si. In the producing process of the semiconductor element, the diffusion of Cu to peripheral elements can be prevented by covering the Cu wiring with a diffusion prevention film.

At the time of dicing, however, the alignment marks formed in the dicing line area are damaged, and flying Cu adheres to the side surface or the back surface of the chip. Cu adhering to the chip diffuses to the element area by a following thermal process and gives a bad influence to the element characteristics.

BRIEF SUMMARY OF THE INVENTION

The present invention is achieved to solve the above-described problem of the prior art, and its object is to provide a semiconductor device using the Cu wiring which can solve the problems caused by the dicing and also provide a producing method of the semiconductor device.

A first invention is a method of producing a semiconductor device in which at least one alignment mark to be used in an exposure process of a litho-graphic process is formed of a wiring material which is copper or includes copper as a main component, and the method comprises forming the alignment mark entirely in an area outside an area where dicing is to be executed.

In the first invention, it is preferable that the alignment mark is entirely formed in an area where wirings and elements are to be formed.

According to this invention, the alignment mark is entirely formed in an area outside an area (a first area) where the dicing is to be executed and, therefore, the alignment mark is not damaged in the dicing process. For this reason, as copper constituting the alignment mark does not adhere to the chips at the time of the dicing, it is possible to solve the problem that the copper adhering to the semiconductor chips diffuses to the element area by the thermal treatment and thereby give a bad influence to the element characteristics and the like as seen in the prior art.

In addition, by forming the alignment mark entirely in an area (i.e. a second area) where the wirings and elements are to be formed, an interval between the first area and the second area can be made small. (When the first area and the second area have same width, the interval therebetween becomes zero.) Therefore, an area other than the second area can be made smaller.

A second invention is a semiconductor device in which at least one alignment mark to be used in an exposure process of a lithographic process is formed of a wiring material which is copper or includes copper as a main component, and the alignment mark is entirely formed inside a semiconductor chip separated by a dicing process.

In this invention, as the alignment mark is entirely formed inside the semiconductor chip, the alignment mark is not damaged at the time of dicing. Therefore, copper constituting the alignment mark does not adhere to the semiconductor chip and it is thereby possible to solve the problem that the element characteristics and the like are worsened by diffusion of copper.

A third invention is a method of producing a semiconductor device in which at least one pattern region corresponding to at least one alignment mark to be used in an exposure process of a lithographic process is formed of a wiring material which is copper or includes copper as a main component. After forming the pattern region corresponding to the alignment mark, the wiring material of the pattern region is removed or inactivated.

According to this invention, as the wiring material of the pattern region corresponding to the alignment mark is removed or inactivated, copper that is the wiring material does not adhere to the semiconductor chips even if the alignment mark is damaged at the time of dicing. Therefore, it is possible to solve the problem that the copper adhering to the semiconductor chips diffuses to the element area by the thermal treatment and thereby give a bad influence to the element characteristics and the like as seen in the prior art.

After the process of removing or inactivating the wiring material has been executed, the pattern where the wiring material has been removed or inactivated functions as the alignment mark.

A fourth invention is a method of producing a semiconductor device in which at least one alignment mark to be used in an exposure process of a litho-graphic process is formed of a wiring material which is copper or includes copper as a main component. In this method, the wiring material which is separated from a region where the alignment mark is formed and which adheres to a semiconductor chip, in a dicing process, is removed or inactivated.

According to this invention, the wiring material adhering to the semiconductor chips in the dicing process is removed or inactivated after the dicing process. Therefore, it is possible to solve the problem that the copper adhering to the semiconductor chips diffuses to the element area by the thermal treatment and thereby give a bad influence to the element characteristics and the like as seen in the prior art.

A fifth invention is a method of producing a semiconductor device in which at least one alignment mark to be used in an exposure process of a litho-graphic process is formed of a wiring material which is copper or includes copper as a main component. This method comprises a step of covering a pad formed by using the wiring material, with a protection film, before a dicing process, a step of removing or inactivating the wiring material which is separated from a region where the alignment mark is formed and which adheres to a semiconductor chip, in the dicing process, and a step of removing a part of the protection film to expose a surface of the pad after removing or inactivating the wiring material.

According to this invention, the wiring material adhering to the semiconductor chips in the dicing process is removed or inactivated. Therefore, it is possible to solve the problem that the copper adhering to the semiconductor chips diffuses to the element area by the thermal treatment and thereby give a bad influence to the element characteristics and the like as seen in the prior art.

Further, as the pad area is covered at the time of removing or inactivating the wiring material adhering to the semiconductor chips, it is possible to prevent the wiring material in the pad area from being removed or inactivated.

A sixth invention is a method of producing a semiconductor device in which at least one alignment mark to be used in an exposure process of a litho-graphic process is formed of a wiring material which is copper or includes copper as a main component. Grooves for dividing a semiconductor wafer into semiconductor chips are formed on a surface of the semiconductor wafer opposite to an element formation surface thereof, in the dicing process.

According to this invention, as the formation of the grooves on the semiconductor wafer in the dicing process is executed on a surface opposite to the element formation surface of the semiconductor wafer, it is possible to prevent the alignment mark formed on the element formation surface side from being damaged. Therefore, it is possible to solve the problem that the copper adhering to the semiconductor chips diffuses to the element area by the thermal treatment and thereby give a bad influence to the element characteristics and the like as seen in the prior art.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be explained below with reference to the drawings.

(Embodiment 1)

Figure 1A:
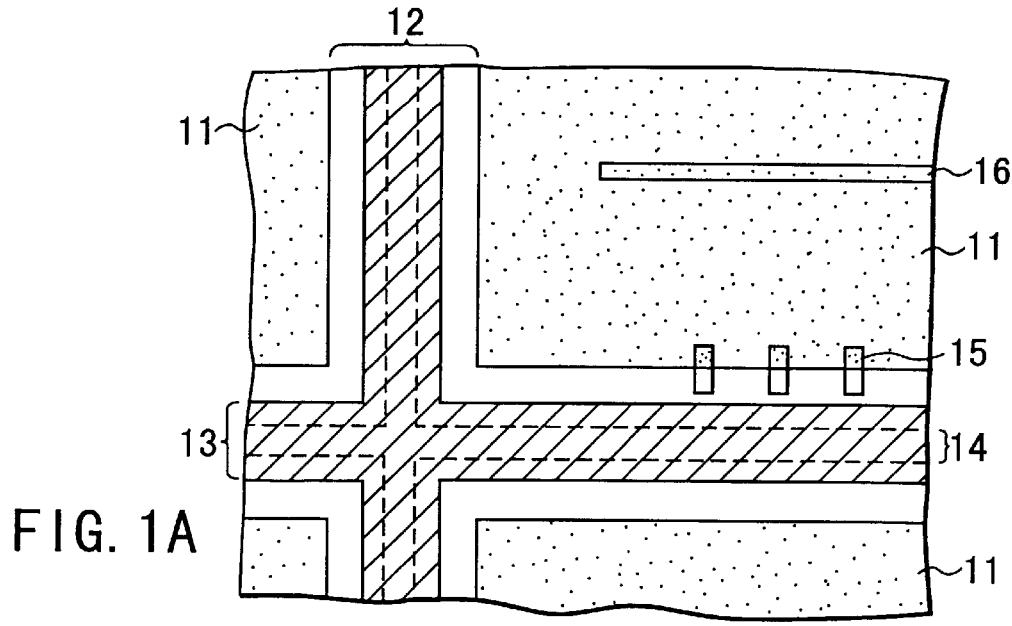
FIGS. 1A and 1B are plan views showing a part of a semiconductor wafer according to a first embodiment of the present invention.
Figure 1B:
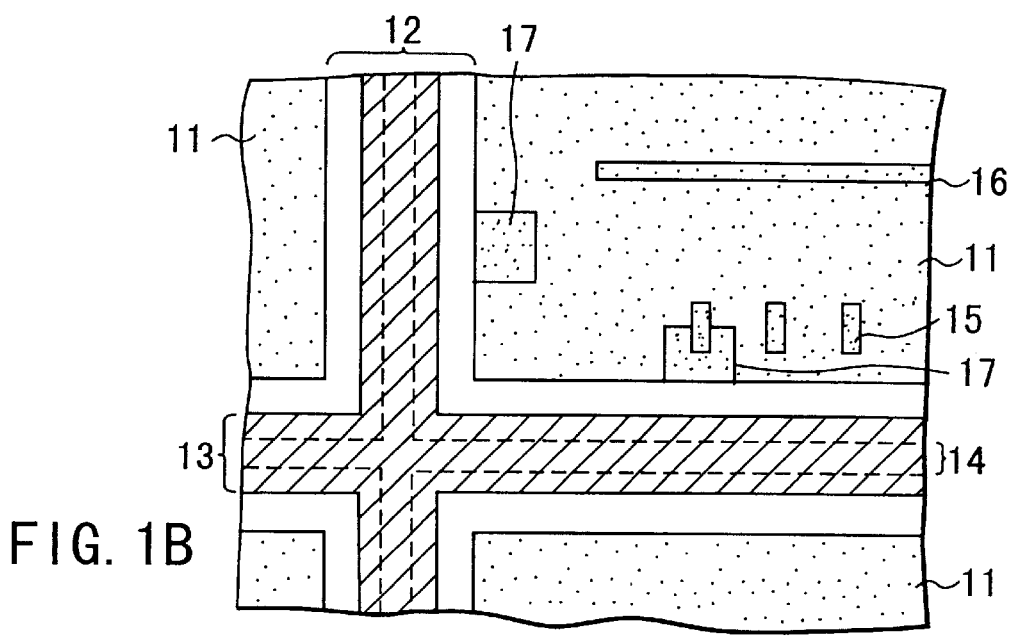

FIGS. 1A and 1B are plan views showing a part of a semiconductor wafer (a silicon wafer or the like) according to a first embodiment of the present invention.

Areas 11 are used to form integrated circuit patterns such as elements (semiconductor elements used for integrated circuit operations and the like) and wiring. The areas 11 are normally shaped in a quadrilateral and include outermost patterns of respective edges at the time of forming the patterns in all the layers. The areas 11 are sectioned from one another by an area 12.

An area 13 is an area where the dicing is to be executed. However, an area 14 where the dicing is actually executed is varied. Therefore, the area 13 is defined by adding margin to the area 14 where the dicing is actually executed.

As shown in the figures, the area 13 wider than the area 14 where the dicing is actually executed exists in the area 12 between the adjacent areas 11, and the width of the area 13 is equal to that of the area 12 at the maximum.

An alignment mark 15 is used in an exposure process of the lithography. The alignment mark 15 is formed by using a wiring material (Cu or a material formed by mixing Cu with a tiny amount of elements (Sn, Ag, Mg, C and the like)) of a wiring 16 formed in the area 11, and in the same process as the formation of the wiring 16. In the present embodiment, the entire alignment mark 15 is formed outside the area 13.

FIG. 1A shows an example of arranging the alignment marks 15 to cross the boundary between the area 11 and the area 12. The entire marks 15 may be arranged in an area sandwiched between the area 11 and the area 13.

FIG. 1B shows an example of arranging the entire alignment marks 15 in the area 11. When the entire alignment marks 15 are arranged in the area 11, there is a merit that the width of the area 12 can be made smaller (i.e. the interval between the area 11 and the area 13 can be made smaller).

In the prior art, the alignment marks 15 are arranged in the vicinity of the center of the area 12. Thus, the alignment marks may be damaged at the time of the dicing, and Cu constituting the alignment marks may fly and adhere to the side surface or the back surface of the chip. In the present embodiment, the entire alignment marks 15 are arranged outside the area 13 and, therefore, the alignment marks are not damaged at the time of the dicing. Therefore, the problem that Cu adhering to the chip may diffuse to the element area by the thermal process can be prevented.

The alignment mark 15 may be arranged outside a part where an element 17 is formed or may be arranged to overlap the part where the element 17 is formed.

(Embodiment 2)

Figure 2A:
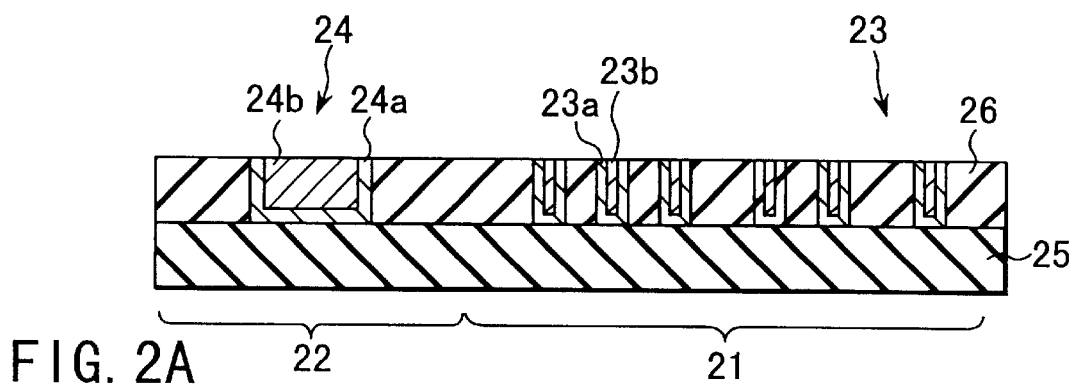
FIGS. 2A to 2C are sectional views showing a part of a semiconductor wafer according to a second embodiment of the present invention.
Figure 2B:
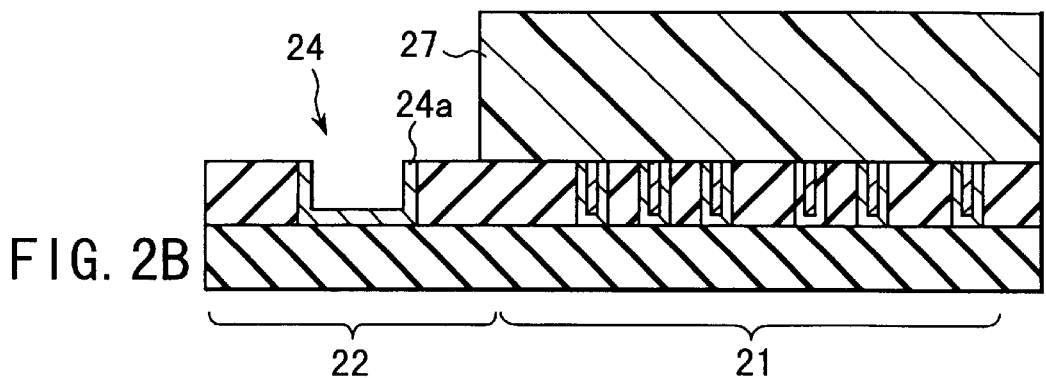
Figure 2C:
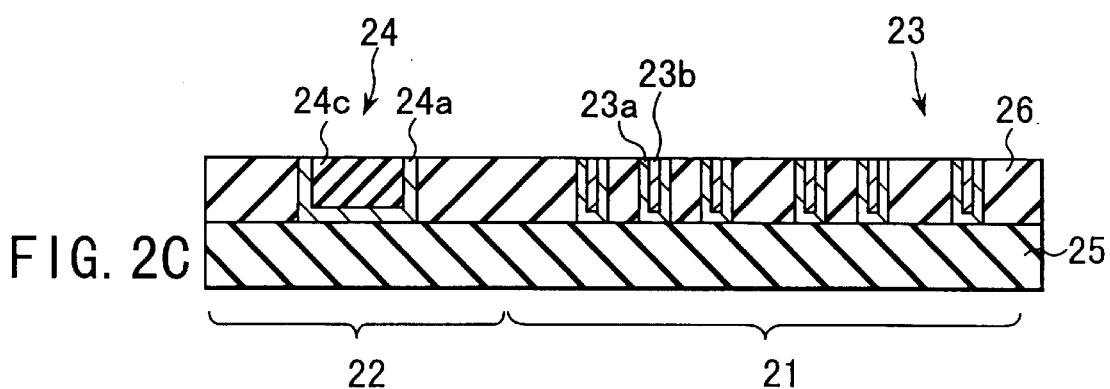

FIGS. 2A to 2C are sectional views showing a part of a semiconductor wafer (a silicon wafer or the like) according to a second embodiment of the present invention.

Areas 21 are areas where integrated circuit patterns of semiconductor elements, wirings and the like (which correspond to the areas 11 of the Embodiment 1). The areas 21 are sectioned from one another by an area 22 (which corresponds to the area 12 of the Embodiment 1) are formed.

FIG. 2A shows a condition that a wiring area 23 and a pattern area 24 corresponding to an alignment mark are formed on a main surface side of a semiconductor wafer (not shown). The process steps will be simply explained. First, interlayer insulation films 25 and 26 are formed on the main surface side of the semiconductor wafer where semiconductor elements and the like are formed. After that, a part of the interlayer insulation film 26 is removed to form a groove corresponding to a wiring pattern and a groove corresponding to the alignment mark. Subsequently, barrier metals 23a and 24a are formed in the grooves, and wiring materials (Cu or materials prepared by mixing Cu with a tiny amount of elements (Sn, Ag, Mg, C and the like)) 23b and 24b are further formed on the barrier metals 23a and 24a.

At a step of FIG. 2B, a resist pattern 27 is formed so as to cover the areas 21. Subsequently, the wiring material 24b exposed to the area 22 is removed in a process using a liquid agent such as (hydrochloric acid and hydrogen peroxide), by using the resist pattern 27 as a mask. In this case, the groove pattern from which the wiring material 24b is removed or the pattern of the barrier metal 24a which is left in the groove functions as an alignment mark.

The wiring material Cu may be inactivated in place of removal of the wiring material 24b exposed in the area 22. For example, an oxidizing treatment using hydrogen peroxide is executed or a thermal treatment is executed in an oxygen atmosphere. In such a treatment, Cu is oxidized and changed to a substance 24c of CuO, $Cu_2O$ or the like that is hardly diffused. The substance is not diffused to the element area even though it adheres to a side wall of the chip.

In the present embodiment, as described above, the wiring material formed in the region corresponding to the alignment mark is removed or inactivated. Therefore, even if the alignment mark is damaged at the time of dicing, the wiring material Cu does not adhere to the chip. For this reason, it is possible to solve the problem that Cu diffuses to the element area and gives a bad influence to the element characteristics and the like.

(Embodiment 3)

Figure 3A:
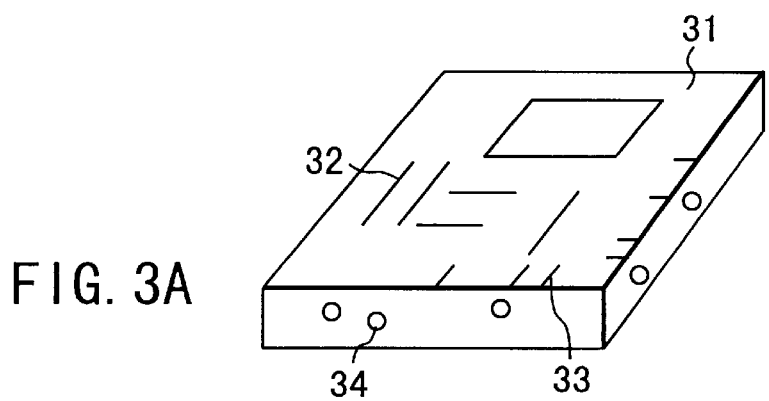
FIGS. 3A and 3B are perspective views showing a third embodiment of the present invention.
Figure 3B:
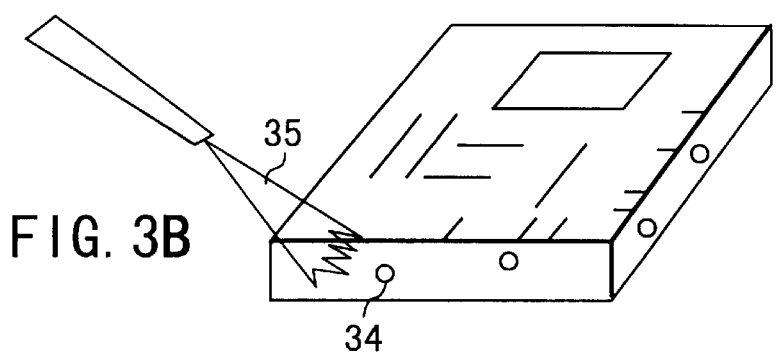

FIGS. 3A and 3B are perspective views showing a third embodiment of the present invention.

A semiconductor chip 31 is obtained by subjecting a semiconductor wafer in the dicing process. In the semiconductor chip 31, an integrated circuit pattern 32 such as elements, wiring and the like, and alignment marks 33 formed of the same wiring material (Cu or a material prepared by mixing Cu with a tiny amount of elements (Sn, Ag, Mg, C and the like)) in the same process as the wiring, are formed. Cu adherents 34 adhere to the side surfaces of the semiconductor chip 31 by allowing Cu constituting the alignment marks to fly at the time of dicing.

In the present embodiment, after a semiconductor wafer is divided into the semiconductor chips 31, a liquid agent 35 such as (hydrochloric acid and hydrogen peroxide) is sprayed onto the side walls of the chip as shown in FIG. 3B. The Cu adherents 34 adhering to the side walls of the chip are removed by the liquid agent 35.

The element formation surface of the semiconductor chip 31 may be coated with resin such as acrylic resin and dipped into the liquid agent, instead of spraying the liquid agent 35 onto the side walls of the chip.

In the process shown in FIG. 3B, the process of inactivating the Cu adherents 34 may be executed instead of removing them. For example, the oxidizing process using hydrogen peroxide is executed. Thus, the Cu adherents 34 are oxidized and changed to CuO or $Cu_2O$, and thereby the diffusion of Cu can be prevented.

As described above, the Cu adherents adhering to the chip by the dicing are removed or inactivated and, therefore, it is possible to solve the problem caused by allowing Cu to diffuse to the element area and thereby give a bad influence to the element characteristics, in the present embodiment.

(Embodiment 4)

Figure 4A:
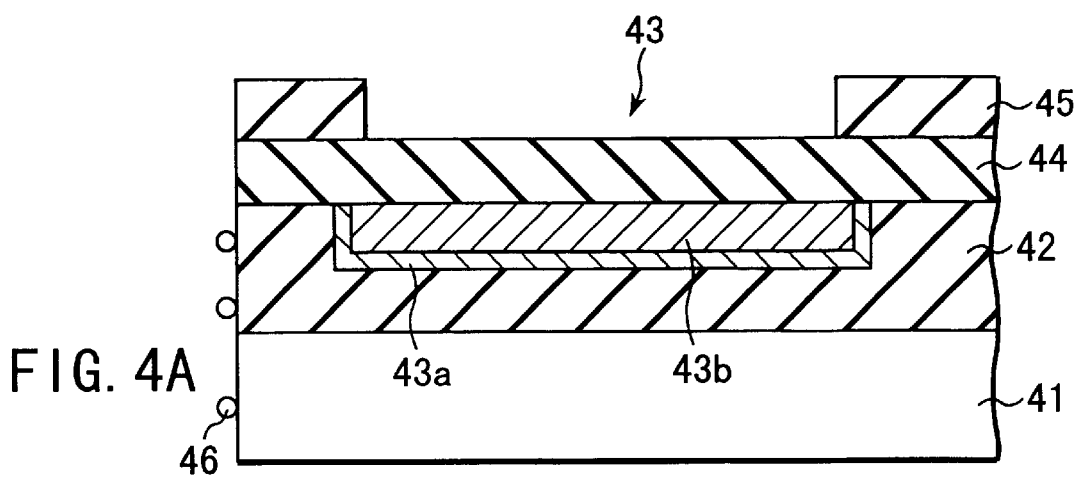
FIGS. 4A and 4B are sectional views showing a part of a semiconductor wafer according to a fourth embodiment of the present invention.
Figure 4B:
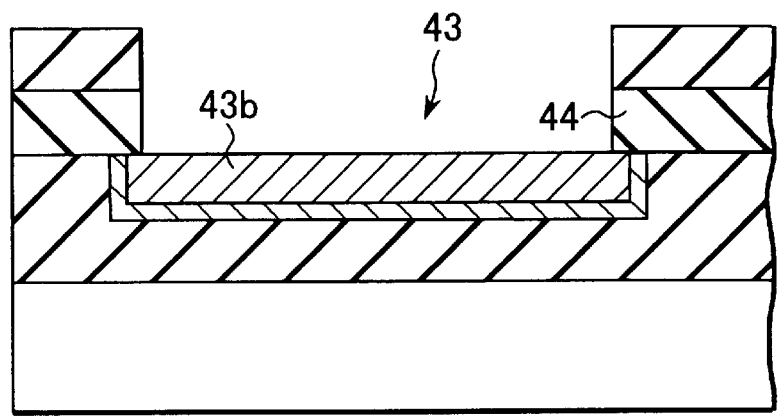

FIGS. 4A and 4B are sectional views showing a part of a semiconductor wafer (a silicon wafer or the like) according to a fourth embodiment of the present invention, and particularly showing a sectional structure in the vicinity of a pad.

A process of FIG. 4A will be explained here. First, an interlayer insulation film 42 is formed on an main surface side of the semiconductor wafer on which the semiconductor elements and wirings and the like are formed. After that, a part of the interlayer insulation film 42 is removed to form grooves for pads and also form grooves for wiring (not shown) and grooves for alignment marks (not shown). Next, a barrier metal 43a is formed in each of these grooves, and a wiring material 43b (Cu or a material prepared by mixing Cu with a tiny amount of elements (Sn, Ag, Mg, C and the like)) is further formed on the barrier metal 43a. Subsequently, interlayer insulation films 44 and 45 are formed.

After that, an opening is formed in the only upper interlayer insulation film 45. No opening is formed in the interlayer insulation film 44 at this time. Thus, the dicing is executed while covering the wiring material 43b of a pad area 43 with the interlayer insulation film 44. Cu adherents 46 adhere to the side walls of the chip by the dicing.

The Cu adherents 46 adhering to the side walls of the chip are removed by dipping the entire body of the chip into a liquid agent of (hydrochloric acid and hydrogen peroxide). At this time, the wiring material 43b of the pad area 43 is not processed in the liquid agent since it is covered with the interlayer insulation film 44. After the liquid agent treatment, an opening is formed in the interlayer insulation film 44 to expose the surface of the wiring material 43b of the pad area 43 as shown in FIG. 4B.

The process of inactivating the Cu adherents 46 may be executed instead of removing them. For example, the oxidizing process using hydrogen peroxide or the like is executed. In this oxidizing process, the Cu adherents 46 are oxidized and changed to a substance such as CuO or $Cu_2O$, which is hardly diffused. In this case, too, the pad area 43 is covered with the interlayer insulation film 44 and, therefore, the wiring material of the pad area is not processed by the liquid agent.

As described above, the pad area is covered with the interlayer insulation film at the time of removing or inactivating the Cu adherents and, therefore, it is possible to prevent the wiring material of the pad area from being removed or inactivated, in the present embodiment.

(Embodiment 5)

Figure 5:
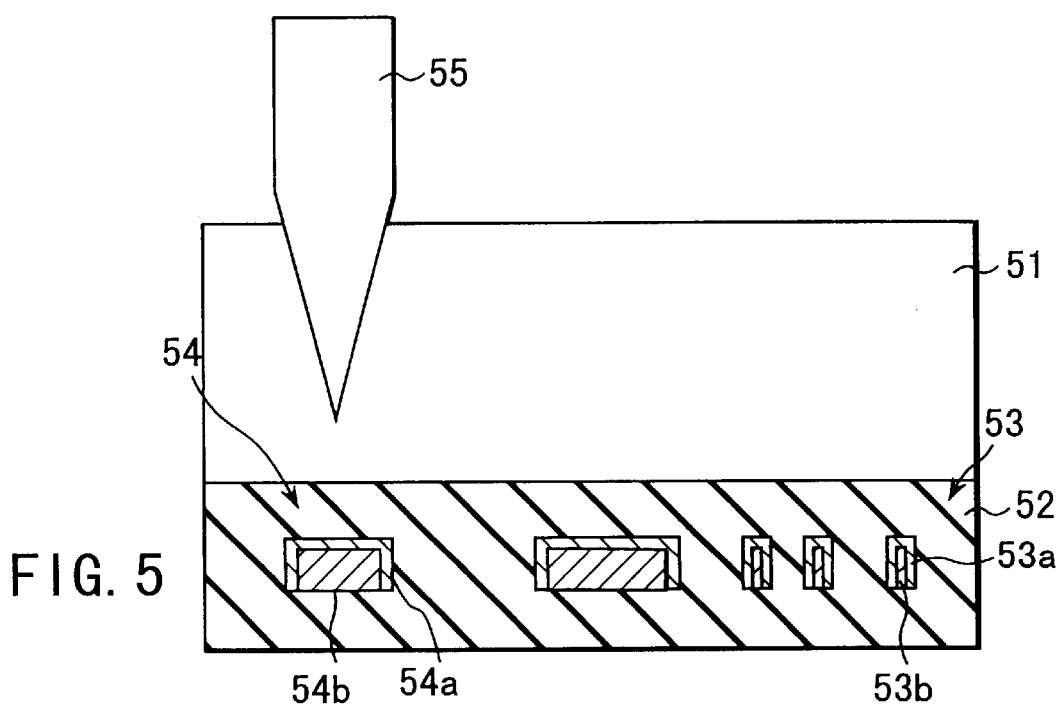
FIG. 5 is a sectional view showing a part of a semiconductor wafer according to a fifth embodiment of the present invention.

FIG. 5 is a sectional views showing a part of a semiconductor wafer (a silicon wafer or the like) according to a fifth embodiment of the present invention.

An interlayer insulation film 52, semiconductor elements (not shown), wirings 53 and alignment marks 54 are formed on a semiconductor wafer 51. The wirings 53 and the alignment marks 54 are formed of the same material in the same process. Wiring materials 53b and 54b (i.e. Cu or a material prepared by mixing Cu with a tiny amount of elements (Sn, Ag, Mg, C and the like)) constituting the wirings 53 and the alignment marks 54 are formed on barrier metals 53a and 54a.

As shown in FIG. 5, a scar which is not so deep as to reach the alignment mark 54, is formed (i.e. a cutaway groove is formed) on the back surface side (i.e. a surface side opposite to the element formation surface) of the semiconductor wafer 51, by a diamond scriber 55 or the like, at the time of the dicing. A cleavage is performed along this scar on the semiconductor wafer 51, which is thereby divided into a plurality of semiconductor chips.

According to a conventional manner, a scar is formed on the front surface side of the semiconductor wafer by the diamond scriber or the like so that a cleavage is performed to the semiconductor wafer. For this reason, the alignment marks in the dicing line area are damaged and Cu adheres to the side surfaces of the chips. In the present embodiment, a scar is formed on the back surface of the semiconductor wafer by the diamond scriber or the like and, therefore, it is possible to prevent the alignment marks from being damaged. Thus, it is possible to solve the problem of allowing Cu adhering to the chips at the time of the dicing to diffuse to the element area by the thermal treatment as seen in the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first region in which an integrated circuit is not provided;
   a second region which is surrounded by the first region and in which an integrated circuit is provided; and
   an alignment mark containing copper, which is entirely provided inside an area including the first and second regions without being in contact with an edge of the semiconductor device, and which crosses a boundary between the first and second regions.

2. A semiconductor device according to claim 1, wherein the integrated circuit in the second region comprises a wiring formed of the same material as the alignment mark.

3. A semiconductor device according to claim 1, wherein the second region is shaped in a rectangle.

4. A semiconductor device according to claim 2, wherein the second region is shaped in a rectangle.

5. A semiconductor device including a first region having no integrated circuit and a second region surrounded by the first region, the semiconductor device comprising:

an integrated circuit being provided inside the second region and having a wiring containing copper; and
   an alignment mark which is formed of the same material as the wiring, which is entirely provided inside an area including the first and second regions without being in contact with an edge of the semiconductor device, and which crosses a boundary between the first and second regions.

6. A semiconductor device according to claim 5, wherein the second region is shaped in a rectangle.

7. A semiconductor device comprising:
   a first region provided along an edge of the semiconductor device;
   a second region being surrounded by the first region and including an integrated circuit; and
   an alignment mark containing copper, which is entirely provided inside an area including the first and second regions without being in contact with the edge of the semiconductor device, and which crosses a boundary between the first and second regions.

8. A semiconductor device according to claim 7, wherein the integrated circuit comprises a wiring formed of the same material as the alignment mark.

9. A semiconductor device according to claim 7, wherein the second region is shaped in a rectangle.

10. A semiconductor device according to claim 8, wherein the second region is shaped in a rectangle.

11. A semiconductor device including a first region provided along an edge of the semiconductor device and a second region surrounded by the first region, the semiconductor device comprising:
    an integrated circuit being provided inside the second region and comprising a wiring containing copper; and
    an alignment mark which is formed of the same material as the wiring, which is entirely provided inside an area including the first and second regions without being in contact with the edge of the semiconductor device, and which crosses a boundary between the first and second regions.

12. A semiconductor device according to claim 11, wherein the second region is shaped in a rectangle.

* * * * *